United States Patent [19]

Hewitt et al.

[11] Patent Number: 5,675,534
[45] Date of Patent: Oct. 7, 1997

[54] METHOD AND APPARATUS FOR PREVENTING UNAUTHORIZED ACCESS TO NONVOLATILE MEMORY IN ELECTRONIC ENCODERS HAVING A VOLTAGE LEVEL DETECTION CIRCUIT

[75] Inventors: Kent Hewitt, Mesa; Willem Smit, Phoenix, both of Ariz.

[73] Assignee: Microchip Technology Incorporated, Chandler, Ariz.

[21] Appl. No.: 611,993

[22] Filed: Mar. 5, 1996

[51] Int. Cl.$^6$ .................................................. G11C 16/06
[52] U.S. Cl. .................. 365/185.04; 365/195; 365/196; 365/228; 235/382; 340/825.31; 340/825.34
[58] Field of Search ..................... 365/185.04, 189.09, 365/196, 195, 228; 235/382; 340/825.31, 825.34

[56] References Cited

U.S. PATENT DOCUMENTS

| | | | |
|---|---|---|---|
| 5,301,161 | 4/1994 | Landgraf et al. | 365/229 |
| 5,554,977 | 9/1996 | Jablonski et al. | 340/825.31 |

*Primary Examiner*—David C. Nelms
*Assistant Examiner*—Andrew Q. Tran
*Attorney, Agent, or Firm*—Matthew G. Reeves

[57] ABSTRACT

According to the present invention, a method is provided for reading data from non-volatile memory in an electronic encoding device such that unauthorized access to the data is prevented. In one embodiment, the method includes the steps of writing a first set of data to the non-volatile memory; generating a voltage detect signal during the writing, the voltage detect signal being representative of a source voltage applied to the non-volatile memory; determining whether the writing was successful by evaluating the voltage detect signal; and reading data from the non-volatile memory responsive to the determination.

6 Claims, 6 Drawing Sheets

METHOD AND APPARATUS FOR PREVENTING UNAUTHORIZED ACCESS TO NONVOLATILE MEMORY IN ELECTRONIC ENCODERS HAVING A VOLTAGE LEVEL DETECTION CIRCUIT

BACKGROUND OF THE INVENTION

This invention relates generally to the field of electronic encoding and decoding, and more particular to encoders and decoders useful for transmitting and receiving signals for remotely controlling systems.

Controlling systems and devices by remote control is becoming increasingly popular in many applications. Examples of such applications are numerous, some of the most common include security systems for buildings, security systems for vehicles, garage door and gate openers. These systems typically employ a transmitter to send an encoded signal to a receiver which decodes the signal and causes the desired operation to be performed. Of course, as these systems become more widely used, unscrupulous efforts to defeat them also increase.

For example, in relatively unsophisticated systems, a single fixed code is transmitted a receiver which has been configured to operate in response to only that particular code. However, a fixed code system is easily defeated by several methods. One method is to use a device called a code scanner which transmits all possible combinations of fixed codes. For example, in systems using eight DIP switches to select the code, there are only two hundred and fifty-six (256) possible fixed code combinations. A coded scanner can typically transmit this number of combinations in less that thirty-two seconds. Even in systems using sixteen bit keys, yielding 65,536 combinations, only a little more than two hours would be required to try all possible combinations. Moreover, the scanner may gain access in far less than this maximum time, in fact, the average time would be half of the maximum time.

Another way of gaining unauthorized access is to simply intercept and retransmit the signal. For example, a remote control transmitter of the type normally used in vehicle security and remote control systems includes a small radio transmitter that transmits a code number on a specific frequency. This code number is normally generated by an integrated circuit encoder. The transmission frequency is usually fixed by legislation within a particular country, therefore it is possible to build a receiver that can receive signals from all such transmitters. Such a receiver is used together with a circuit which records the transmissions captured by the intended receiver. Such a device is known as a code or key grabber and can be used to gain access to protected premises or to vehicles with remote control security systems.

To control the threat of unauthorized access, remote control systems have become increasingly sophisticated.

One method of overcoming the limitations of fixed code systems is to employ code hopping encoders. Code-hopping encoders typically use an algorithm which generates a different code each time the transmitter is operated. At the receiving end, a decoder is provided with a corresponding algorithm for decoding the received transmission.

Figure 1:
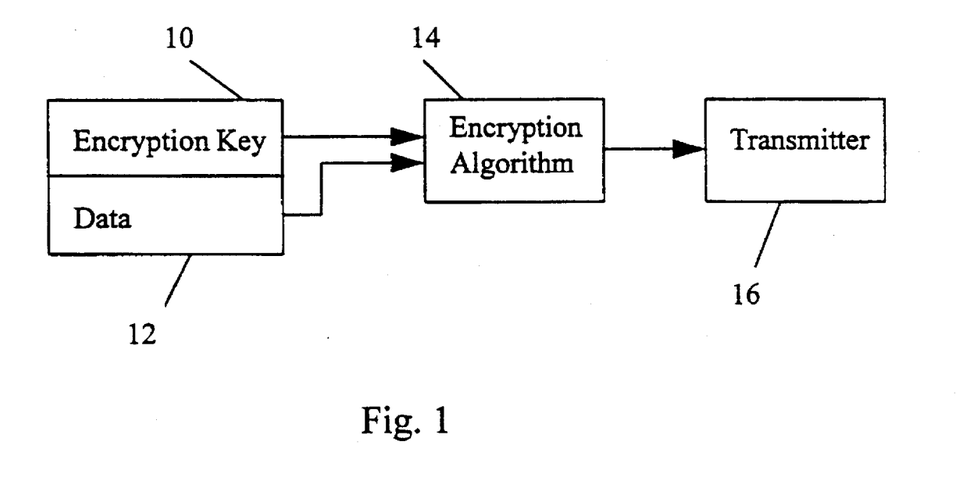
FIG. 1 is a block diagram of a code-hopping encoder.

The algorithms employed in code-hopping encoders typically use one or more encryption keys provided by the manufacturer as a parameter in generating the final output code. An example of this system is shown in FIG. 1. An encryption key 10, stored in memory, is provided to the encryption algorithm 14 along with the data to be encrypted 12. The data to be transmitted includes such information as the synchronization counter and the serial number of the device. This information is used by a remote receiver to determine whether it is receiving a transmission from a valid transmitter and to decode the transmission. The encryption algorithm 14 operates with the encryption key 10 to encrypt the data 12 before supplying it to the transmitter 16. The transmitter 16 then transmits the encrypted data to the receiver via radio frequency, infrared, or other suitable transmission means.

The encryption key is typically stored in non-volatile memory, such as EEPROM, so that the encryption key is not lost when power is removed from the device. When the encoding device is in its normal operating mode, the encryption key is either not transmitted, or transmitted in an encrypted form. Therefore, there is no danger of unauthorized access to the encryption key. However, other modes of operation of the encoding device are provided in which the encryption key may be read from EEPROM memory without being encoded. For example, when the device is being manufactured, the manufacturer must be able to read the EEPROM memory immediately after programming in order to ensure that proper programming of the memory has taken place. Therefore, the encoder must permit other modes of operation in which the EEPROM, or nonvolatile memory, may be directly accessed without using the encryption algorithm. This creates the danger that an unauthorized operator may place the encoding device into the program mode and read the EEPROM memory, thus obtaining the encryption key.

To address this danger, it is possible to design an encoding device to allow only one read from non-volatile memory immediately following an erasure, or write, to the EEPROM memory. In theory, this prevents unauthorized access to the non-volatile memory because the memory contents must first be overwritten before a read is allowed. However, in practice it is possible to place the encoding device into a condition where a write to non-volatile memory would fail, for example, by providing a low power supply voltage while maintaining the device at a high temperature. A write to memory could then be performed which would not overwrite the contents of the memory, but would cause the device to indicate a write had occurred. The device would then permit a read to non-volatile memory, revealing the encryption keys to an unauthorized operator.

It is therefore an object of the present invention to provide a method and apparatus of overcoming the above-discussed problems, as well as provide further advantages over present devices which will become apparent in view of the following disclosure.

SUMMARY OF THE INVENTION

According to the present invention, a method is provided for reading data from nonvolatile memory in an electronic encoding device such that unauthorized access to the data is prevented. In one embodiment, the method comprises the steps of writing a first set of data to the non-volatile memory; generating a voltage detect signal during the writing, the voltage detect signal being representative of a source voltage applied to the non-volatile memory; determining whether the writing was successful by evaluating the voltage detect signal; and reading data from the non-volatile memory responsive to the determination.

According to another embodiment of the invention, a system is provided for reading data from non-volatile memory in an electronic encoding device such that unauthorized access to the data is prevented. In a further embodiment, the system comprises means for writing a first set of data to the non-volatile memory; means for generating a voltage detect signal during the writing, the voltage detect signal being representative of a source voltage applied to the non-volatile memory; means for determining whether the writing was successful by evaluating the voltage detect signal; and means for reading data from the non-volatile memory responsive to the determination.

In yet a further embodiment of the invention, an electronic encoding device is provided. In one embodiment, the electronic encoding device comprises non-volatile memory; a controller accessible to the non-volatile memory; encoder logic accessible to the non-volatile memory; input logic in electrical communication with the controller; output logic in electrical communication with the non-volatile memory; and a voltage level detection circuit which provides a signal responsive to a non-volatile memory write voltage to enable a read from non-volatile memory.

BRIEF DESCRIPTION OF THE DRAWINGS

The invention is further described by way of example with reference to the accompanying drawings in which.

BRIEF DESCRIPTION OF EMBODIMENTS OF THE INVENTION

Figure 2:
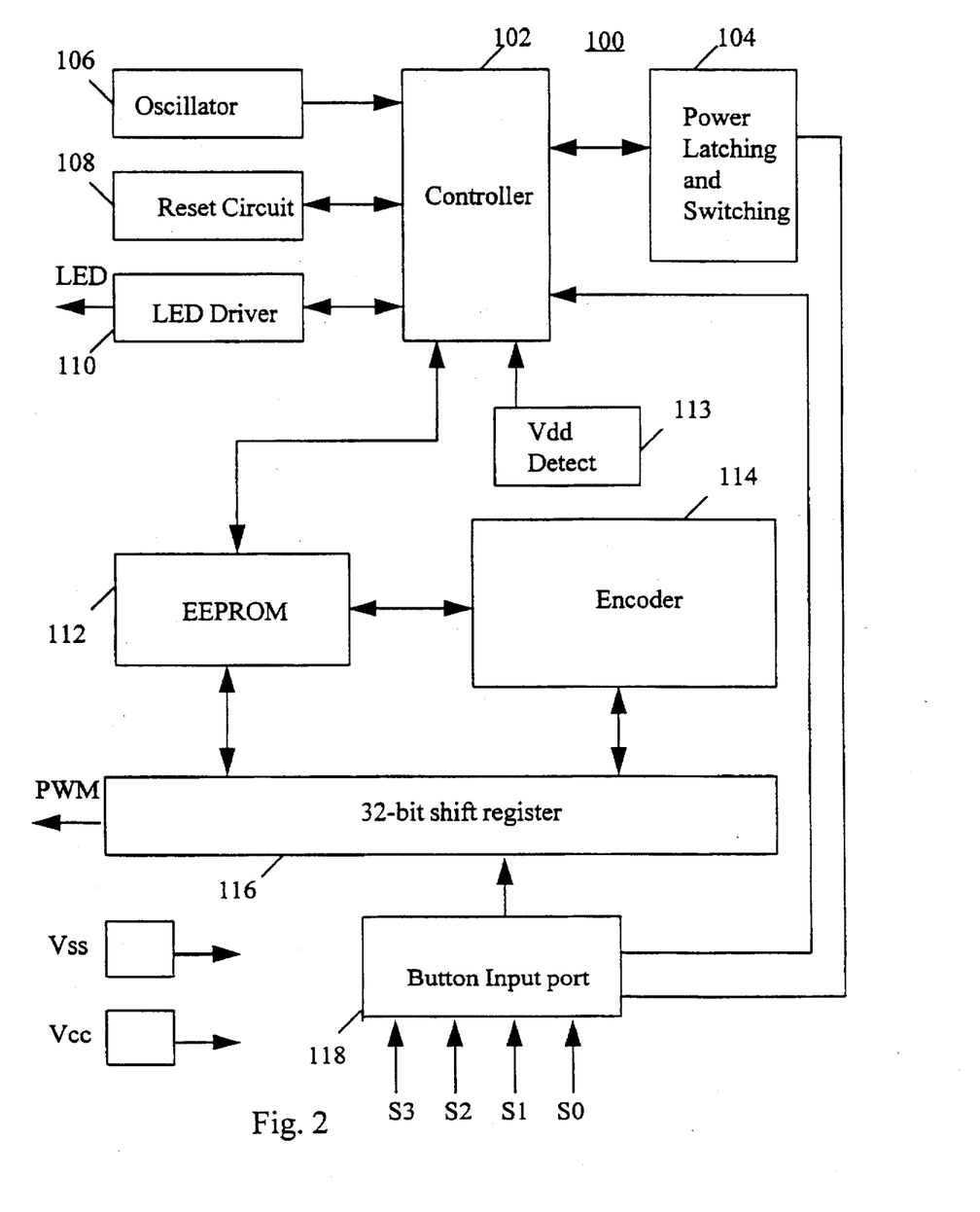
FIG. 2 is a block diagram of an electronic encoding device according to an embodiment of the present invention.

Referring now to FIG. 2, there is shown a block diagram of an electronic encoding device according to an embodiment of the present invention. In this example, the electronic encoding device 100 comprises a controller 102 which is electronically connected to several peripheral circuits, such as oscillator 106, reset circuit 108, LED driver 110 and power latching and switching circuit 104 which provide supporting functions for the controller 102. In other embodiments, additional circuits, such as communication ports, are provided with the controller, and in still further embodiments these circuits may be integrated into the controller 102 directly. The exact controller used is not critical, and suitable controllers will occur to those of skill in the art.

The controller 102 receives user input through input logic. In the example shown, the input logic comprises button input port 118 which receives input from four external switches S0–S3 However, it is understood that other suitable types of input systems may be used, such as serial ports, keyboards, etc. The controller 102 accesses non-volatile memory, in this case. EEPROM memory 112. Depending on the user input, the controller 102 can cause data to be written to EEPROM memory 112, or to be read from EEPROM memory 112 through output logic incorporated in the device 100. In this case, the output logic comprises a 32-bit shift register 116 whose contents are transmitted to a pulse width modulating circuit (not shown). Information sent to the pulse width modulating circuit is then transmitted by the encoding device to a remote receiver. Like the input logic, the output logic shown is only one suitable embodiment, and others will occur to those skilled in the art. For example, in another version of the invention, data from EEPROM 112 is provided to a serial communication port which may be read by external equipment to determine the contents of the EEPROM memory 112.

Also connected to EEPROM memory 112 is encoder logic 114. The encoder logic 114 also accesses EEPROM 112 in order to encode the data to be transmitted and provide the encoded data to the 32-bit shift register 116 for transmission via the pulse width modulator circuit.

As discussed previously, in the standard operating mode, the data sent from the pulse width modulator is encoded by encoder 114 prior to transmission. Therefore, even if the encryption key is contained in the data, it still cannot be determined through unauthorized interception of a transmitted code.

However, when the device 100 is in program mode, the contents of EEPROM 112 can be read at least once immediately following a write to the EEPROM memory 112 in order to verify the contents of EEPROM 112. To prevent unauthorized access of EEPROM memory 112 by purposefully creating a faulty write then immediately reading the contents of EEPROM memory, a voltage level detection circuit 113 is provided. In one embodiment, the voltage level detection circuit 113 generates a signal, responsive to the non-volatile memory write voltage, to enable or disable a read from non-volatile memory 112. This prevents a faulty write to EEPROM memory 112 from setting the encoding device 100 in condition to allow a memory read because a memory read will only be allowed if the EEPROM memory write voltage was sufficiently high to ensure the data in EEPROM memory 112 would have been changed. Thus, it is only possible to read back from the EEPROM memory 112 exactly what was immediately written to it. This is described in further detail with respect to FIG. 3.

Figure 3:
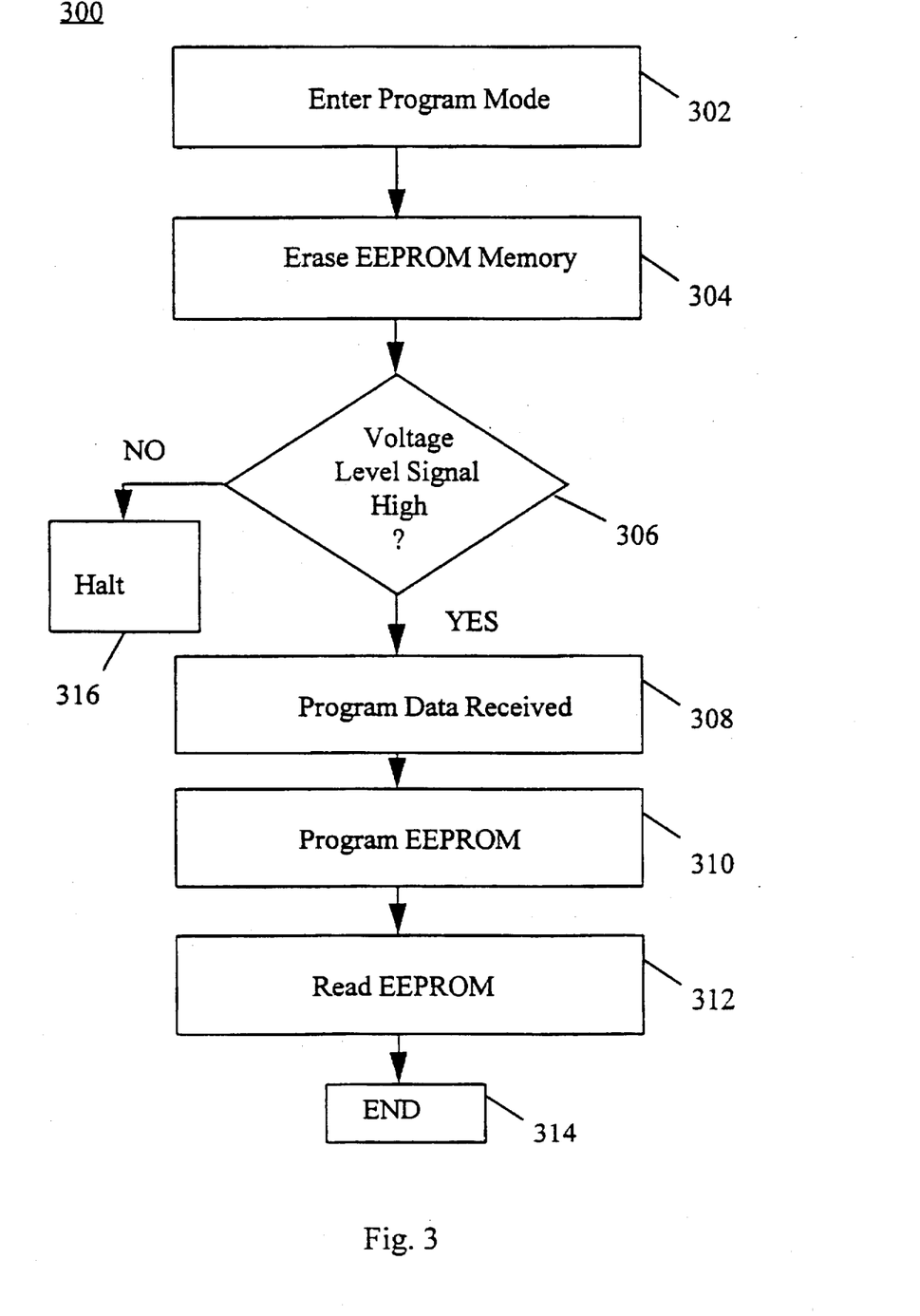
FIG. 3 is a flow chart showing the operation of a read from non-volatile memory in the encoden device according to an embodiment of the invention.

FIG. 3 is a flow chart 300 showing the operation of a read from EEPROM memory 112 in the encoder device 100. In this embodiment, the encoder device 100 is first placed in program mode in step 302. Next, in step 304, the entire contents of EEPROM memory 112 are erased, or at least overwritten with new data. Flow then proceeds to step 306 in which the signal from the voltage level detection circuit is tested to ensure that the write voltage to EEPROM memory 112 was sufficiently high to ensure that the contents were changed. If this voltage was not sufficiently high, then the process is halted in step 316, and no read from EEPROM memory 112 is allowed. However, if the voltage was high enough, the process proceeds to step 308 in which the data for programming the EEPROM memory 112 is retrieved. In this embodiment, the contents of EEPROM memory 112 have been erased, i.e., set to logical zero in step 304. Therefore, in step 310 the desired data, such as the serial number, encryption key, etc., is programmed into EEPROM memory 112 in step 310. This data is read back at step 312 to verify the contents of EEPROM memory 112, then the process is ended in step 314.

Figure 4:
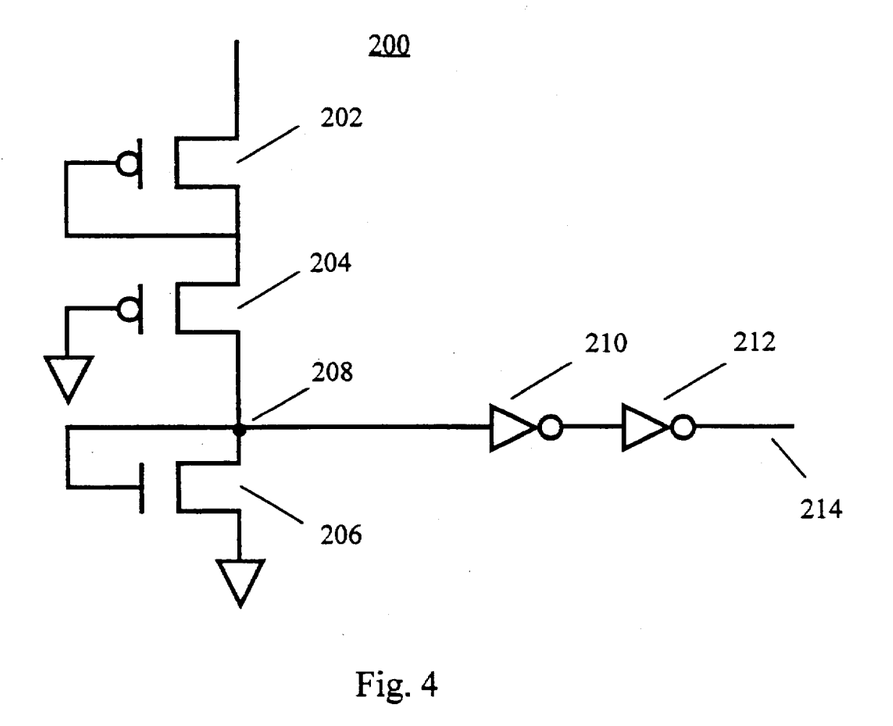
FIG. 4 is a schematic diagram of a circuit according to the present invention, which provides a voltage level detection signal used to allow a memory read.

FIG. 4 is a schematic diagram of a circuit useful in the present invention for providing the voltage level detection signal. In this embodiment, a pair of P-channel transistors 202, 204, are connected in a series. The source of transistor 202 is connected to supply voltage Vdd, or the memory write voltage. The gate of transistor 202 is connected to the source of transistor 204, while the gate of transistor 204 is connected to ground. Depending on the voltage requirements of the encoder system 100, different threshold voltages are provided for these P-channel transistors 202, 204. Depending on the voltage requirements, these threshold voltages may be set at different levels. For example, if it is desired to set a trip point, i.e., a voltage level at which a read from EEPROM memory 112 will be allowed, at 3.5 volts, then the threshold voltages of each of transistors 202, 204 are set at −1.5 volts.

The drain of transistor 204 is connected to the source of N-channel transistor 206. The drain of N-channel transistor 206 is connected to the ground, while its gate is connected to node 208. In this example, the threshold voltage of transistor 206 is 0.1 volts. The desired trip voltage will now appear at node 208 when the memory write voltage is sufficiently high. It is desirable to set the trip point high enough to guarantee a successful write at all temperatures. Therefore, a signal path from line 208 is provided through buffers 210 and 212 to voltage trip signal at node 214.

The voltage trip signal provided at node 214 will be a logical one if the voltage level at node 208 was sufficiently high during the previous write to EEPROM memory 112, or a logical zero otherwise.

Of course, the circuit shown in FIG. 4 is only one possible embodiment. Other suitable circuits for detecting the voltage applied to the EEPROM memory during a write will occur to those skilled in the art. For example, referring now to FIG. 5, there is shown a circuit according to another embodiment of the invention.

Figure 5:
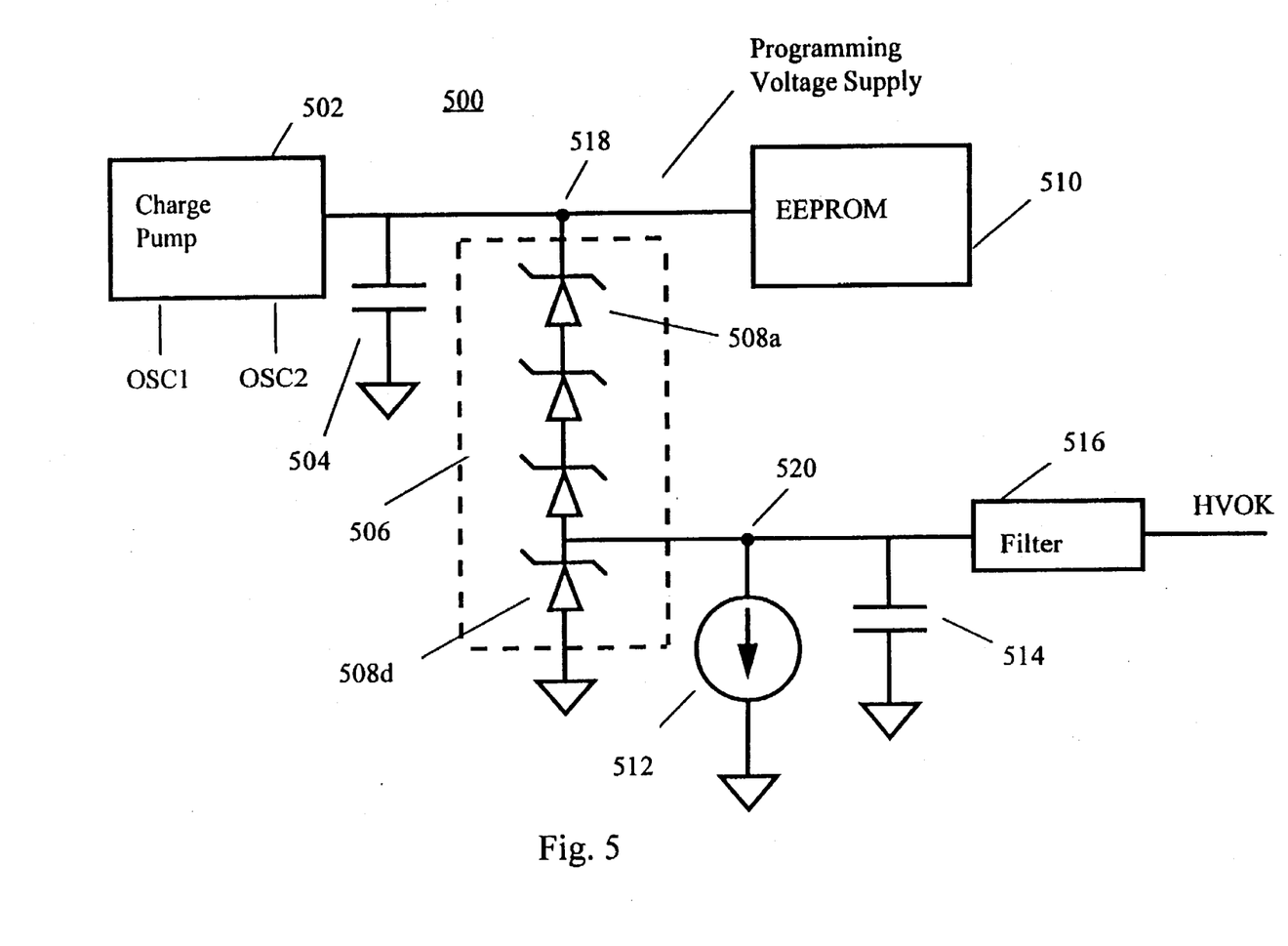
FIG. 5 is a circuit according to a further embodiment of the invention which provides a signal for allowing a read from non-volatile memory.

Rather than sensing the Vdd, or source voltage, which is applied to the non-volatile memory, the circuit shown in FIG. 5 directly senses the write voltage applied to the non-volatile memory cell. Specifically, in order to write to non-volatile memory, in this case, EEPROM memory 510, a charge pump 502 is used. Charge pump 502 is driven by oscillators OSC1 and OSC2 to charge capacitor 504 to a voltage level sufficiently high enough to write to EEPROM memory 510. A typical write voltage level would be approximately 20 volts, depending on the circuitry and technology used in EEPROM 510. In order to ensure that the write voltage applied to EEPROM 510 was high enough to guarantee a successful write, a voltage clamping circuit 506 is connected to the write, or programming, voltage supply, at node 518. In this embodiment, the voltage clamping circuit 506 comprises four series-connected Zener diodes 508a–508d. For purposes of illustration, it is assumed that 20 volts is required to ensure a successful write to EEPROM 510. In this case, each of Zener diodes 508a–508d has a 5 volt breakdown voltage. Therefore, the voltage at node 520 will be 5 volts when a suitable memory write voltage is developed at node 518. A small current source 512, such as a current mirror or a resistor, drains off charge from node 520 to prevent charge buildup which would cause node 520 to retain a 5 volt charge when node 518 falls below 20 volts.

Of course, due to the operation of charge pump 502, the voltage at node 520 will not be a flat DC level, but will have a spike wave form which must be smoothed by filter 516. In one embodiment, filter 516 comprises a Schmidt trigger circuit. However, the exact implementation of the filter is not critical, and other suitable examples will occur to those who are skilled in the art.

Here, the output of filter 516 is referred to as the "HVOK" signal, and it is sampled to ensure that the write to EEPROM memory 510 was successful. If the voltage at node 518 was insufficient to program the EEPROM memory 510, then this will be reflected in the HVOK signal, thus halting charge pump operation and terminating EEPROM write and programming sequence. Consequently, a subsequent read of EEPROM memory 510 will not be permitted by the encoding device.

Figure 6:
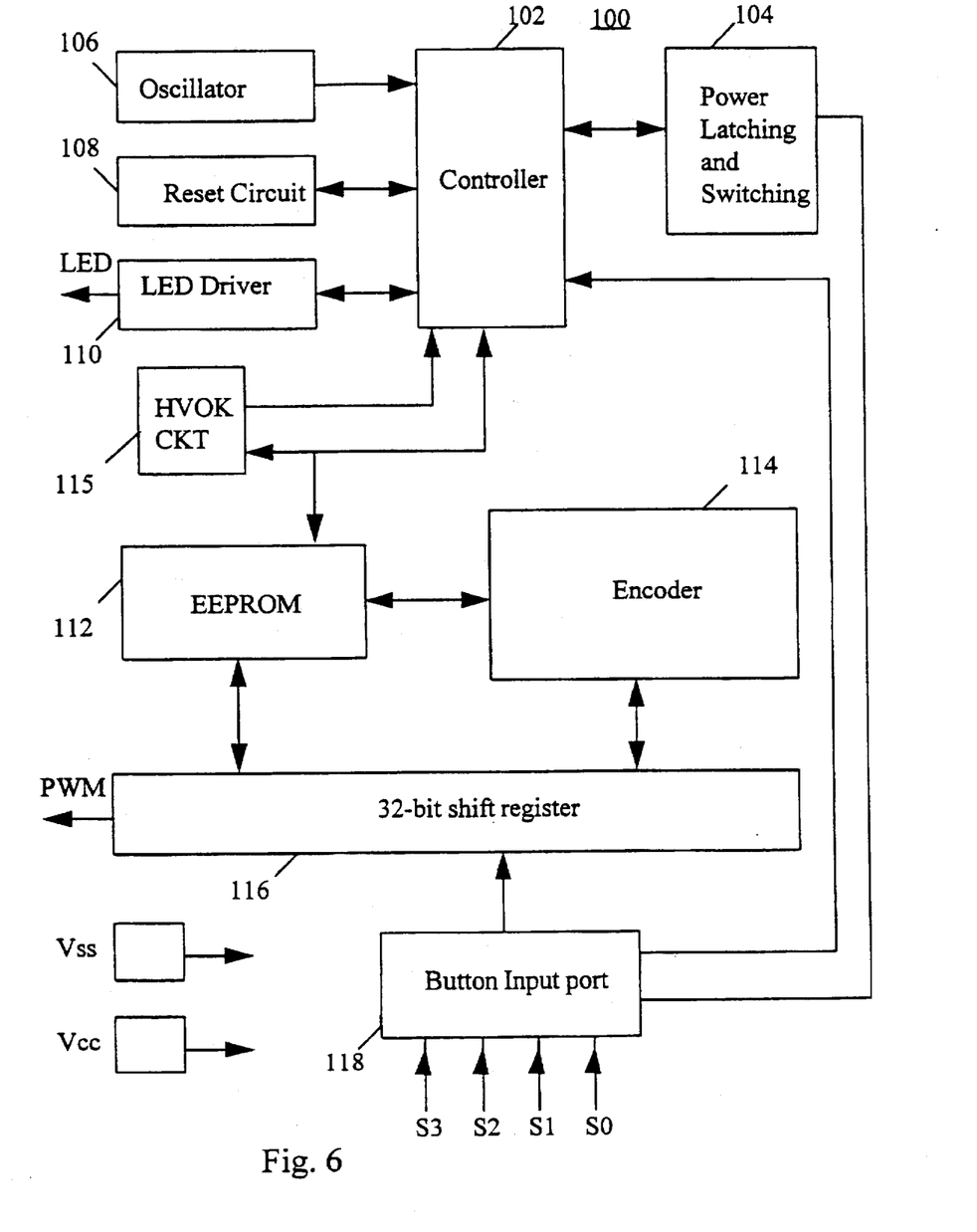
FIG. 6 is a block diagram of an electronic encoding device according to still a further embodiment of the invention.

FIG. 6 is a block diagram of an encoding device according to another embodiment of the invention showing the incorporation of the circuit in FIG. 5 into the encoding device. In this case, the HVOK circuit 115 samples the voltage level applied to the write lines of EEPROM 112 as discussed previously. The HVOK signal itself is then provided to controller 102 which determines whether a successful write to EEPROM memory 112 has occurred and a subsequent read will be allowed. In one embodiment, the steps required to read the non-volatile memory are substantially the same as those shown in the flow chart of FIG. 3; however, in step 306, the actual memory write voltage would be sampled (via the HVOK signal) rather than the Vdd trip signal.

With an encoding device as described in the above embodiments, the non-volatile memory must first be erased, or overwritten, before the data contained therein may be read. Moreover, unauthorized access to non-volatile memory by deliberately performing a faulty write to EEPROM memory 112 is prevented. Of course, the above-described embodiments are merely illustrative of the present invention, and other suitable embodiments will occur to those with skill in the art without departing from the scope and spirit of the present invention.

What is claimed is:

1. A method for reading data from non-volatile memory in an electronic encoding device such that unauthorized access to the data is prevented, the method comprising:

writing a first set of data to the non-volatile memory;

generating a voltage detect signal during the writing, the voltage detect signal being representative of a source voltage applied to the non-volatile memory;

determining whether the writing was successful by evaluating the voltage detect signal;

reading data from the non-volatile memory responsive to the determination.

2. A system for reading data from non-volatile memory in an electronic encoding device such that unauthorized access to the data is prevented, the system comprising:

means for writing a first set of data to the non-volatile memory;

means for generating a voltage detect signal during the writing, the voltage detect signal being representative of a source voltage applied to the non-volatile memory;

means for determining whether the writing was successful by evaluating the voltage detect signal; and means for reading data from the non-volatile memory responsive to the determination.

3. An electronic encoding device comprising:

a non-volatile memory;

a controller coupled to the non-volatile memory;

encoder logic coupled to the non-volatile memory;

input logic coupled to the controller;

output logic coupled to the non-volatile memory; and a voltage level detection circuit coupled to the non-volatile memory, which provides a signal responsive to a non-volatile memory write voltage to enable a read from said non-volatile memory.

4. An electronic encoding device as in claim 3 wherein the voltage level detection circuit comprises:

a pair of series connected P-channel transistors, each transistor having a first threshold voltage;

an N-channel transistor having a second threshold voltage; the N-channel transistor being in series with the pair of P-channel transistors;

a voltage detect signal path connected between a source of the N-channel transistor and the controller.

5. A method for reading data from non-volatile memory in an electronic encoding device such that unauthorized access to the data is prevented, the method comprising:

writing a first set of data to the non-volatile memory;

generating a voltage detect signal during the writing, the voltage detect signal being representative of a write voltage applied to the non-volatile memory;

determining whether the writing was successful by evaluating the voltage detect signal;

reading data from the non-volatile memory responsive to the determination.

6. An electronic encoding device comprising:

and non-volatile memory;

a controller coupled the non-volatile memory;

encoder logic coupled to the non-volatile memory;

input logic coupled to the controller;

output logic coupled to the non-volatile memory; and a voltage level detection circuit coupled to the non-volatile memory, which provides a signal responsive to a source voltage applied to the non-volatile memory, during writing to said non-volatile memory the signal being enabling of a read from said non-volatile memory.

* * * * *